United States Patent
Huang et al.

(10) Patent No.: US 10,321,614 B1
(45) Date of Patent: Jun. 11, 2019

(54) DISPLAY ASSEMBLY WITH HEAT DISSIPATION

(71) Applicant: Wistron Corporation, New Taipei (TW)

(72) Inventors: Huan-Yuan Huang, New Taipei (TW); Yu-Hua Chang, New Taipei (TW); Wei-Cheng Wang, New Taipei (TW)

(73) Assignee: Wistron Corporation, New Taipei (TW)

(*) Notice: Subject to any disclaimer, the term of this patent is extended or adjusted under 35 U.S.C. 154(b) by 0 days.

(21) Appl. No.: 15/950,141

(22) Filed: Apr. 10, 2018

(30) Foreign Application Priority Data

Dec. 12, 2017 (TW) .............................. 106218396 U

(51) Int. Cl.
| | |
|---|---|
| *H05K 7/20* | (2006.01) |
| *G02F 1/1333* | (2006.01) |
| *G02F 1/1335* | (2006.01) |
| *G02F 1/13357* | (2006.01) |

(52) U.S. Cl.
CPC ....... *H05K 7/20972* (2013.01); *G02F 1/1336* (2013.01); *G02F 1/133308* (2013.01); *H05K 7/20145* (2013.01); *G02F 1/133385* (2013.01); *G02F 2001/133314* (2013.01); *G02F 2001/133628* (2013.01)

(58) Field of Classification Search
USPC ........ 361/679.46–679.51, 695–697; 454/184
See application file for complete search history.

(56) References Cited

U.S. PATENT DOCUMENTS

| | | | | |
|---|---|---|---|---|
| 7,667,964 | B2* | 2/2010 | Kang | G02F 1/133308 313/582 |
| 8,654,302 | B2* | 2/2014 | Dunn | G02F 1/133385 349/161 |
| 8,823,916 | B2* | 9/2014 | Hubbard | G02F 1/133308 165/104.34 |
| 9,456,525 | B2* | 9/2016 | Yoon | H05K 7/20145 |
| 2009/0126914 | A1* | 5/2009 | Dunn | H05K 7/20972 165/121 |
| 2009/0139261 | A1* | 6/2009 | Nakano | F24F 12/006 62/455 |
| 2012/0106766 | A1* | 5/2012 | Kuroda | H04M 1/035 381/337 |
| 2018/0088368 | A1* | 3/2018 | Notoshi | F21V 29/65 |

FOREIGN PATENT DOCUMENTS

| | | |
|---|---|---|
| TW | I311219 | 6/2009 |
| TW | 201142428 A1 | 12/2011 |
| TW | I386712 B1 | 2/2013 |

* cited by examiner

*Primary Examiner* — Zachary Pape
(74) *Attorney, Agent, or Firm* — Winston Hsu

(57) ABSTRACT

An outdoor flat panel display assembly is provided to redesign the back cover of a display module where an isolated external circulation structure may be implemented to the back cover of the display module and the back plate of the case. Cold air is introduced into the heat dissipation space within the back cover via external circulating route while heat produced by the backlight, the system circuit board, and by the radiation of the sun can be dissipated through the external circulating route. The external circulation space is completely isolated from the internal space of the case in such a way that the vapor and dust in the introduced cold air are in no way to have contact with the components of the display and the glass of the case.

19 Claims, 13 Drawing Sheets

DISPLAY ASSEMBLY WITH HEAT DISSIPATION

BACKGROUND OF THE INVENTION

1. Field of the Invention

The invention relates to a display, and more particularly, to a display assembly with heat dissipation for outdoor use.

2. Description of the Prior Art

Current outdoor flat panel displays, as to be operable in an outdoor environment with sunlight, are required with high brightness which, compared to the general indoor displays mostly designed to provide brightness in 250-500 lm, usually comes up to 2500 lm. Such high brightness requirement of an outdoor display has led to the result of excessively more heat from its illuminating components than from the illuminating components of an ordinary display. Active heat dissipation scheme should be provided for the outdoor flat panel displays in response to the problems of malfunctions of the equipment or even burning caused by overheating inside the equipment.

On the other hand, constant exposure of the outdoor flat panel display under direct or indirect sunlight accumulates the radiant heat and also magnifies the increase of temperature in the equipment, which is even more hazardous to a liquid crystal display. In most cases, these outdoor flat panel displays are equipped with transparent case for protection of the LCD screen. The closed case is a major cause of heat elevation as similar with the greenhouse effect when absorbing the radiation of sun, which inherently accumulates in the space between the case and the LCD screen whose life will be further degraded.

A common solution for the outdoor flat panel displays is to include discharging fans or internal air condition equipment, or to make more cooling room between the front glass plate and the display. However, oversize of the overall device, expense of the air conditioner with constant maintenance requirement, and regular cleaning work for the protective front glass plate still remains problems to be solved.

SUMMARY OF THE INVENTION

To solve the above problems, an embodiment of the invention provides a display assembly with heat dissipation including a case, a display module, a heat dissipation assembly, and a circulation structure. The case includes a main body and a back plate detachably assembled with the main body. The back plate has a first inlet and a first outlet, and a first circulation space is formed inside the case when the back plate is assembled with the main body. The display module is disposed in the case. The heat dissipation assembly is disposed at a side of the display module and includes a second inlet and a second outlet. The circulation structure includes an intake channel, a convention generator, and an exhaust channel. The intake channel is connected between the first inlet and the second inlet. The convection generator is disposed at the intake channel. The exhaust channel is connected between the first outlet and the second outlet. A second circulation space is form in the circulation structure by the intake channel, the heat dissipation assembly, and the exhaust channel, with the convection generator bringing an air flow to enter the first inlet through the second circulation space and be discharged from the first outlet.

In the embodiment of the invention, the heat dissipation assembly includes a first heat dissipation component and a second heat dissipation component. The first heat dissipation component contacts a backlight source of the display module and the second heat dissipation component includes the second inlet and the second outlet. The first heat dissipation component and the second heat dissipation component cooperatively form a heat dissipation space when the first heat dissipation component and the second heat dissipation component are connected with each other.

In the embodiment of the invention, the first heat dissipation component and the second heat dissipation component are made of aluminum and the second heat dissipation component further includes a plurality of cooling fins extending towards the first circulation space.

In the embodiment of the invention, the first heat dissipation component and the second heat dissipation component form a unitary structure.

In the embodiment of the invention, the heat dissipation assembly is a back cover of the display module.

In the embodiment of the invention, the circulation structure further includes another convection generator disposed at the exhaust channel and the convection generators respectively disposed at the intake channel and the exhaust channel are spoilers or fans.

In the embodiment of the invention, the display assembly also includes an internal fan set disposed within the case for circulating air in the first circulation space.

In the embodiment of the invention, the display module is an LCD module.

In the embodiment of the invention, the main body includes a transparent front plate faced with a display surface of the display module and the first circulation space includes space between the front plate of the case and the display surface of the display module.

In the embodiment of the invention, the display assembly also includes two dust shields respectively covering the first inlet and the first outlet.

In the embodiment of the invention, junctions of the intake channel to the first inlet and the second inlet are air-tight and water-proof and junctions of the exhaust channel to the first outlet and the second outlet are air-tight and water-proof.

In the embodiment of the invention, the first circulation space is isolated and disconnected from the second circulation space.

The outdoor flat panel display assembly provided in the invention employs an external circulation to introduce cold air into the heat dissipation space formed in the back cover of the display module. Heat generated by the backlight source of the display module, the circuit board of the system, and radiation of the sun can be effectively brought out of the case. Complete isolation of the heat dissipation space from the internal space of the case substantially keeps the vapor and dust contained in the introduced cold air away from having contact with the components of the display and the glass of the case, extensively reducing the workload of cleaning and maintenance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. In the following discussion and in the claims, the terms "include" and "comprise" are used in an open-ended fashion. Also, the term "couple" is intended to mean either an indirect or direct electrical/mechanical connection. Thus, if a first device is coupled to a second device, that connection may be through a direct electrical/mechanical connection, or through an indirect electrical/mechanical connection via other devices and connections.

Figure 1:
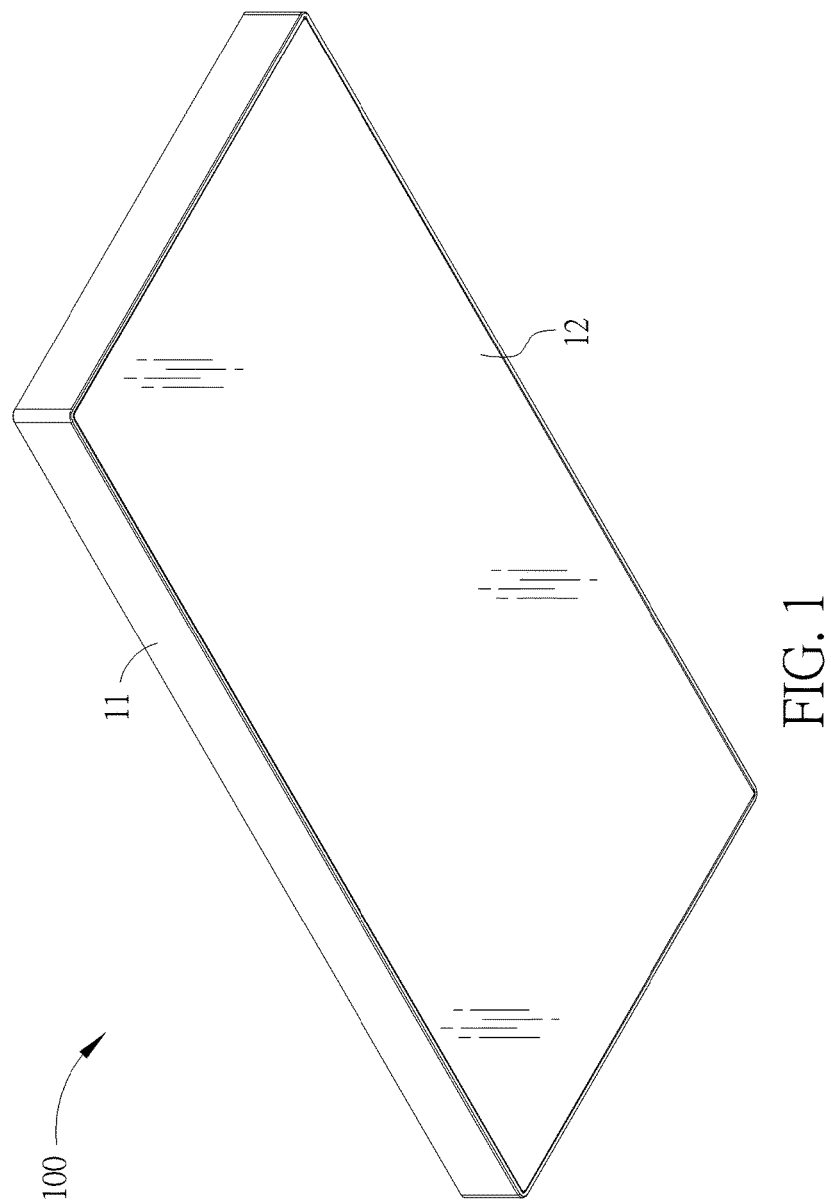
FIG. 1 is a schematic diagram of a front perspective view of an outdoor display assembly having heat dissipation according an embodiment of the invention.
Figure 2:
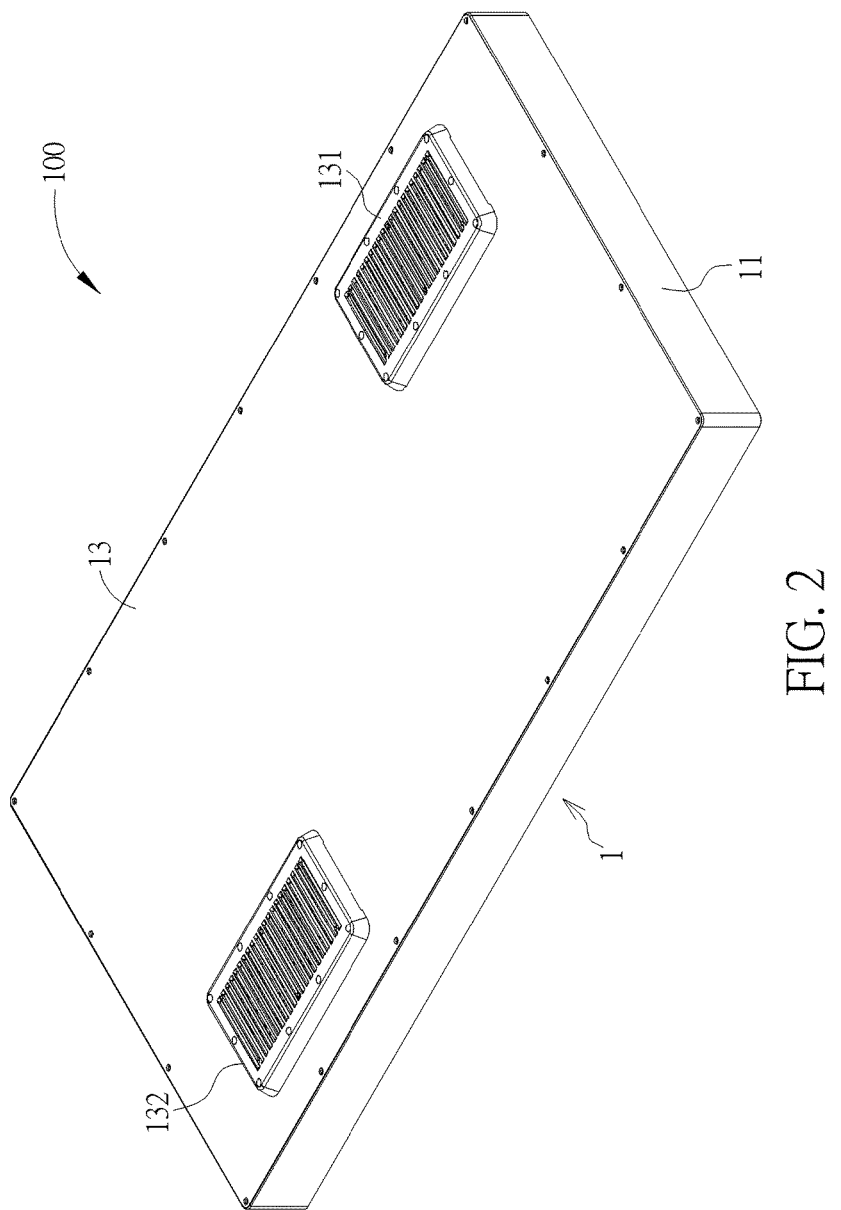
FIG. 2 is a schematic diagram showing a back perspective view of the display assembly.
Figure 3:
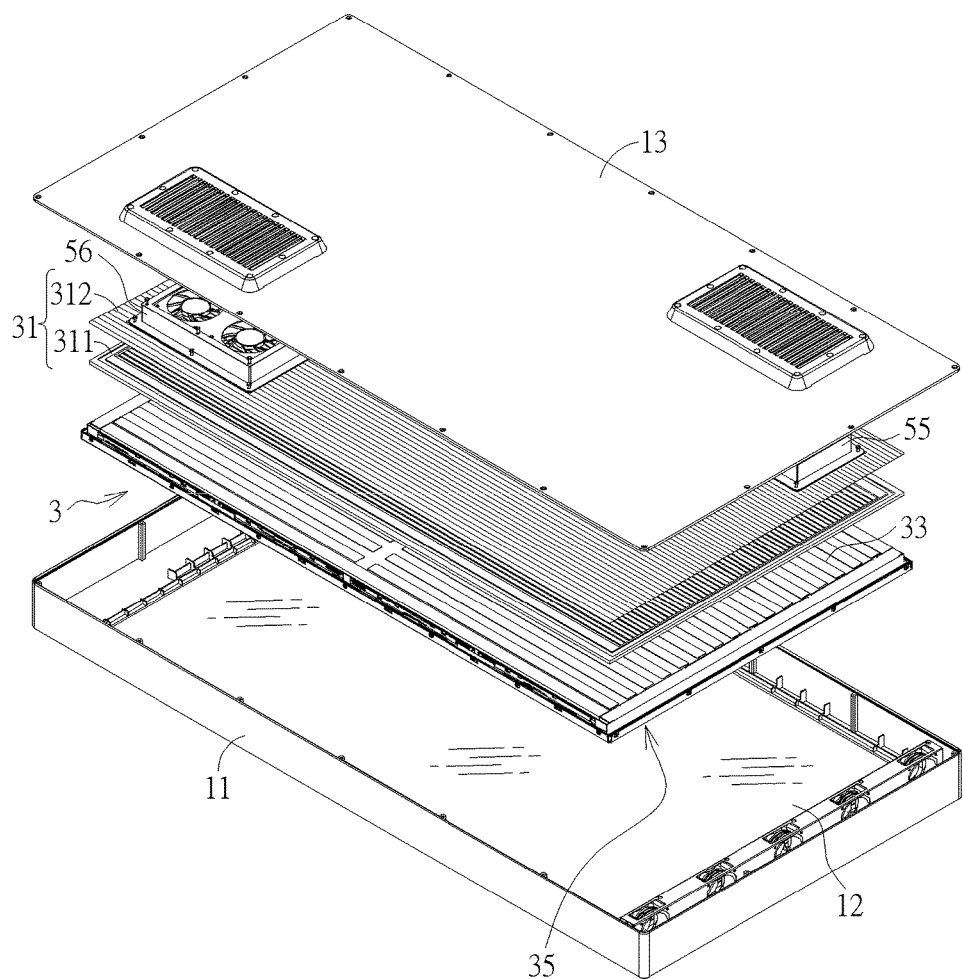
FIG. 3 is a schematic diagram of an exploded view of each components of the display assembly.
Figure 4:
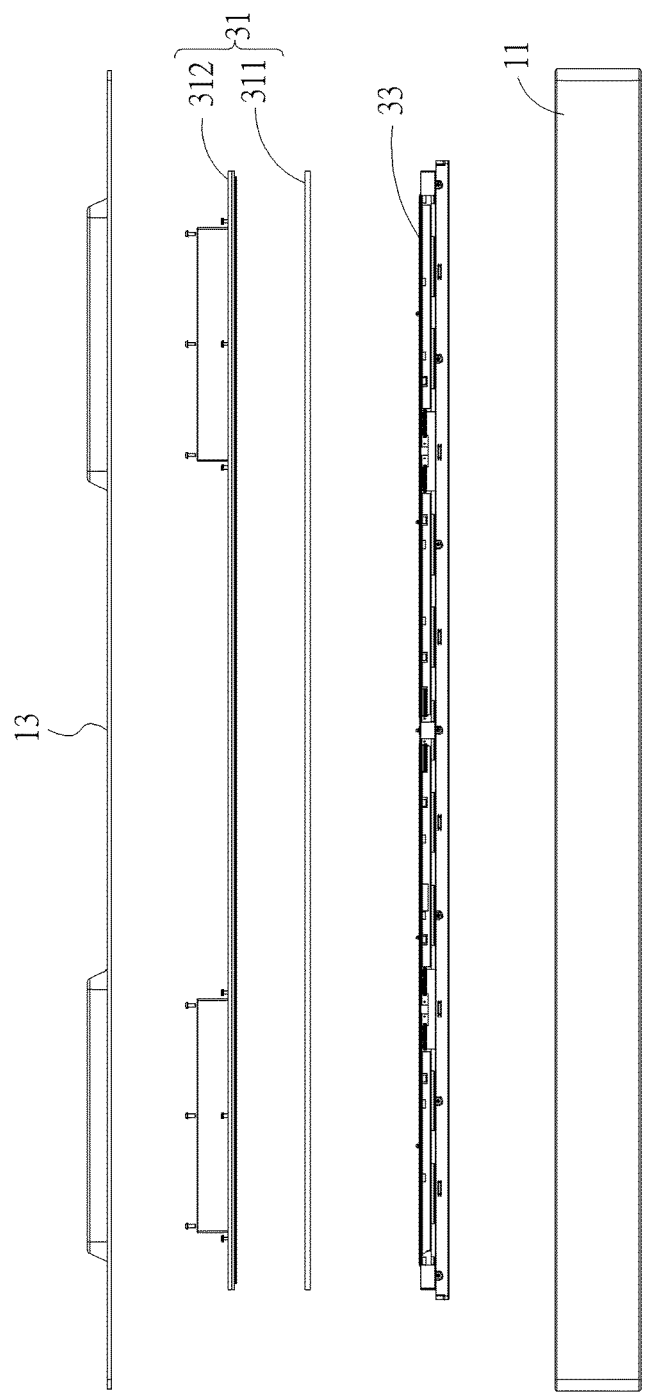
FIG. 4 is a schematic diagram showing a side view of FIG. 3.
Figure 5:
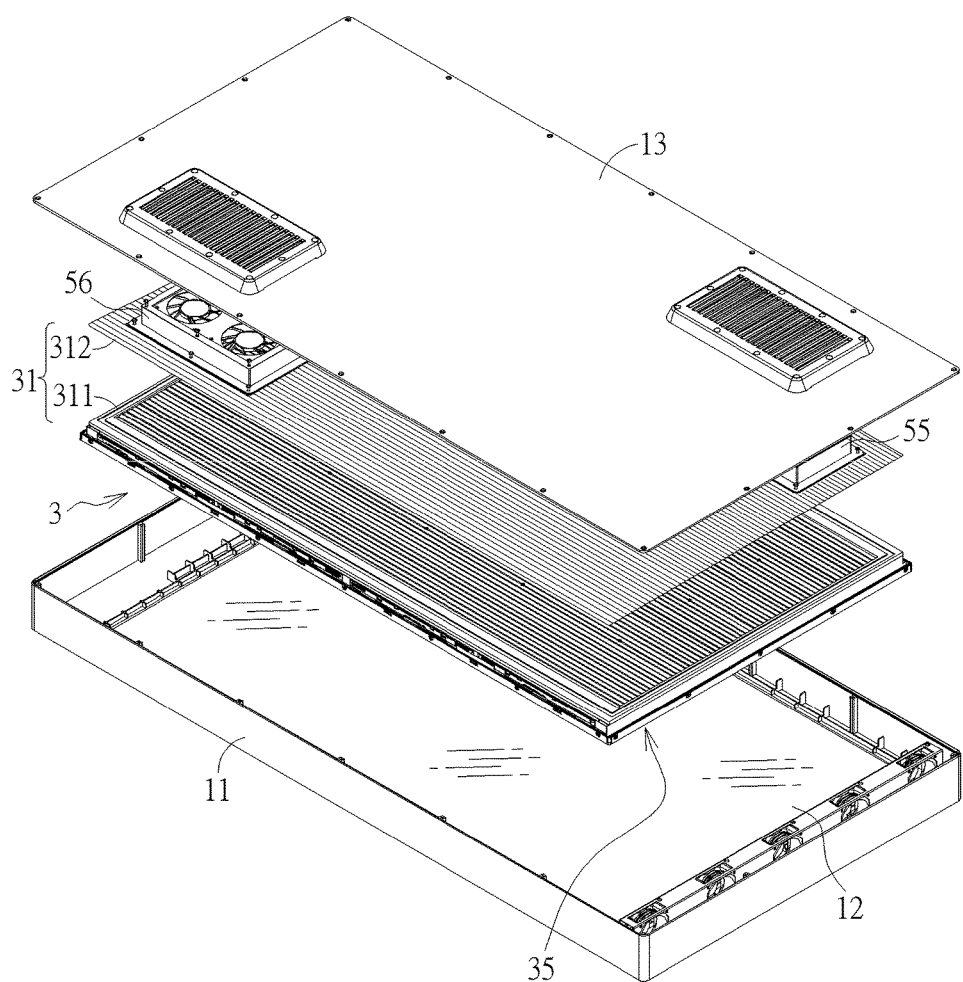
FIG. 5 is a schematic diagram showing an exploded view of the display assembly in another status.

Please refer to FIG. 1 to FIG. 5. FIG. 1 is a schematic diagram of a front perspective view of an outdoor display assembly having heat dissipation structure according to an embodiment of the invention, FIG. 2 is a schematic diagram showing a back perspective view of the display assembly, FIG. 3 is a schematic diagram of an exploded view of each components of the display assembly, FIG. 4 is a schematic diagram showing a side view of FIG. 3, and FIG. 5 is a schematic diagram showing an exploded view of the display assembly in another status. The display assembly 100 can be in the form of a flat panel display substantially including a case 1, a display module 3, and a circulation structure, which is hidden in the case 1 and will be illustrated and described in the following illustrations and paragraphs. The high brightness display module 3 can be a liquid crystal display module disposed within the case 1 to be away from dust and humid. The case 1 includes a main body 11 and a back plate 13 detachably assembled with the main body 11. In the assembly line, the display module 3 is placed into the main body 11 and fastened before the back plate 13 is assembled to the main body 11 to form a seal, water and dust proof space for outdoor use. The main body 11 has a transparent front plate 12 that may be embodied as a transparent glass, to which a display surface 35 of the display module 3 faces and images and content of the display surface 35 of the display module 3 can be seen through the front plate 12. A first inlet 131 and a first outlet 132 are disposed at the back plate 13 for configuring the heat dissipation structure while further openings are provided with water and dust proof at the case 1 for power and signal wirings of the display module 3.

The display module 3 includes a backlight source 33 along with other necessary components such as a light guide plate, a reflective plate, optical films, liquid crystal component, polarized films, cover lens, etc., which are not illustrated or described respectively but of which any person skilled in the art has knowledge. The display assembly 100 further includes a heat dissipation assembly 31 disposed at a side of the display module 3, which can be in one embodiment exemplified as a back cover of the display module 3 served as rear cooling and protection of the display module 3 where a backlight source 33, preferably a direct light emitting diode (LED) source in the invention, is directly assembled to and has contact with the heat dissipation assembly 31 and the heat generated from the illumination of the backlight source 33 may be conducted to dissipate by the heat dissipation assembly 31. For example, the embodiment in the illustration shows that the heat dissipation assembly 31 includes a first heat dissipation component 311 and a second heat dissipation component 312 connected, particularly in sealing coupling in a preferred embodiment, with each other, with the first heat dissipation component 311 contacting to assemble with the backlight source 33 as shown in FIG. 5. In a preferred embodiment, the first heat dissipation component 311 and the second heat dissipation component 312 are made of aluminum and exist as two separate parts as shown in the illustration, while in another embodiment, the first heat dissipation component 311 and the second heat dissipation component 312 may also form a unitary structure. In still another embodiment, the heat dissipation assembly 31 may also be implemented as a stand-along component further attached to the backlight source 33 along with a back frame of the display module 3, with the first heat dissipation component 311 directly fixed to the back frame of the display module 3.

Figure 6:
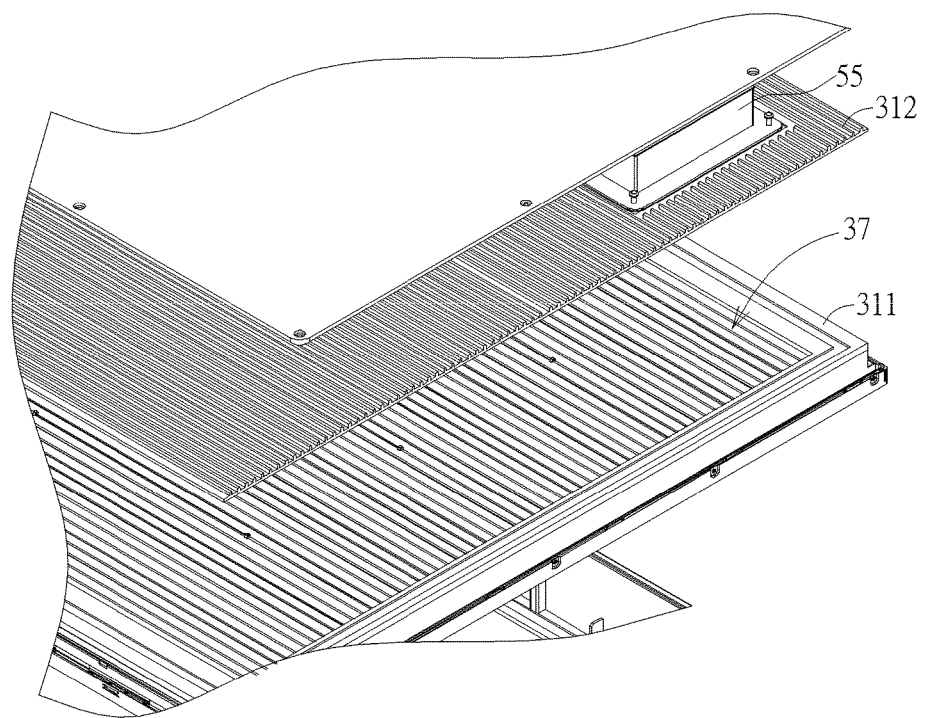
FIG. 6 is a schematic diagram showing a partial view of the first heat dissipation component and the second heat dissipation component of the heat dissipation assembly.
Figure 7:
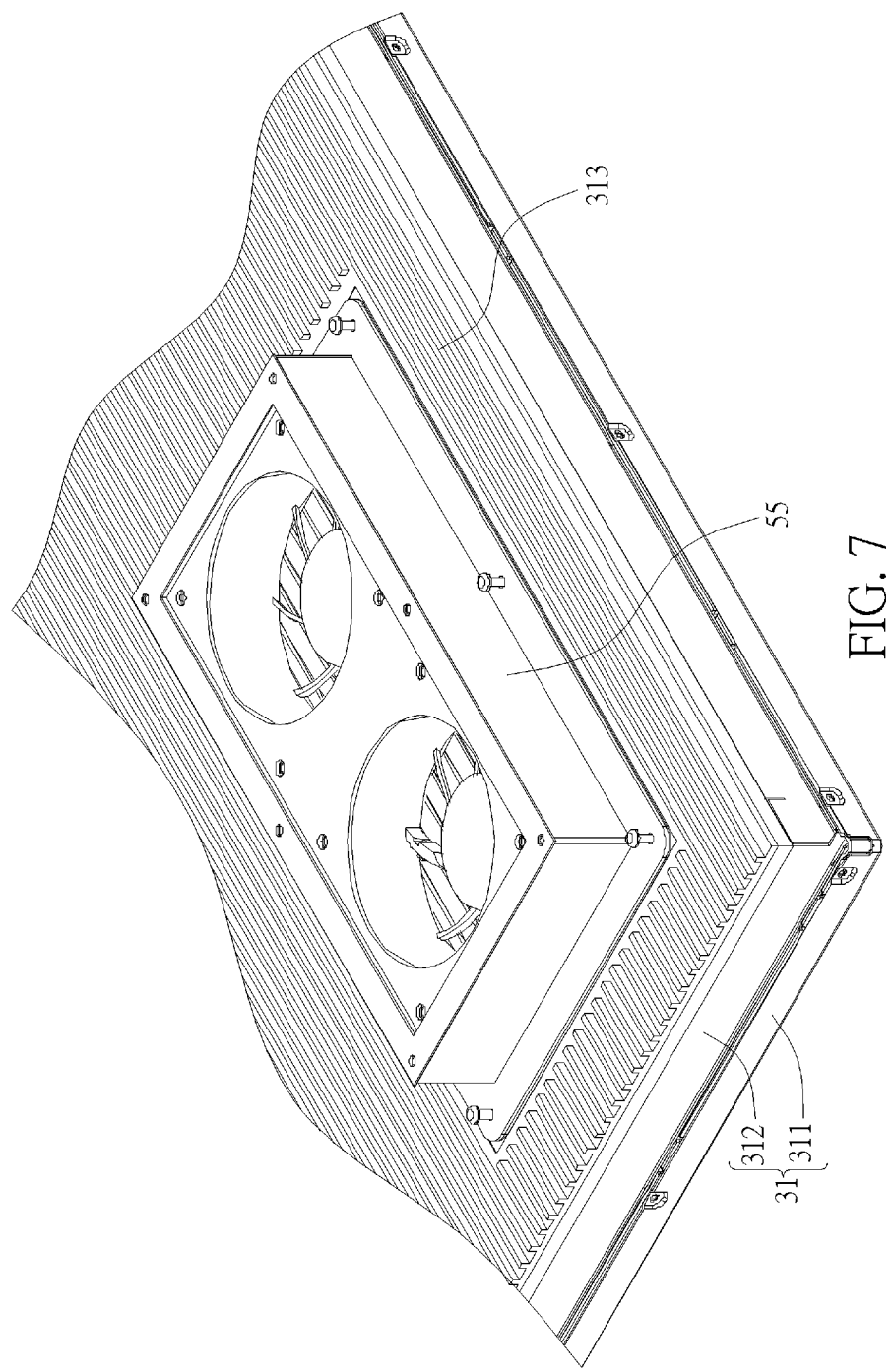
FIG. 7 is a schematic diagram showing a view where the first heat dissipation component and the second heat dissipation component connected with each other.

Please refer to FIG. 6 and FIG. 7. FIG. 6 is a schematic diagram showing a partial view of the first heat dissipation component and the second heat dissipation component of the heat dissipation assembly and FIG. 7 is a schematic diagram showing a view where the first heat dissipation component and the second heat dissipation component connected with each other. The heat dissipation assembly 31 comes with a hollow and sealed cooling structure whose first heat dissipation component 311 and second heat dissipation component 312 cooperatively form a heat dissipation space 37, providing a passage for outside cold air, as they are tightly coupled with each other.

Figure 8:
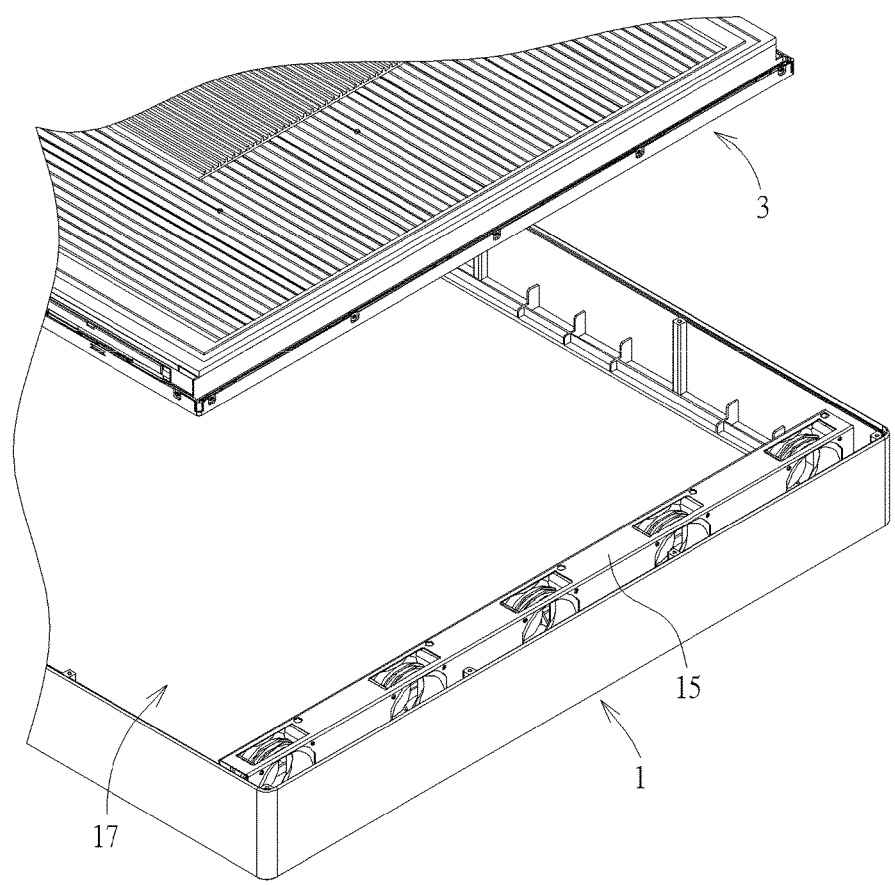
FIG. 8 is a schematic diagram showing that the display module before placed within the case.

Please refer to FIG. 8, which is a schematic diagram showing that the display module before placed within the case. Provided as a protective component for the display module 3, the case 1 establishes a first circulation space 17 (an internal circulation space) therein when the display module 3 is disposed in the case 1. The first circulation space 17 in the case 1 can be made completely sealed and isolated from the outside after a seal work is offered between the first inlet 131 and the inward channel and between the first outlet 132 and the outward channel. The display assembly 100 of the invention may further include an internal fan set 15 disposed within the case 1 at a side, which is utilized for facilitating the circulation of the air in the first circulation space 17. It should be noted that the sealing coupling between the first heat dissipation component 311 and the second heat dissipation component 312 indicates not only the sealing feature for the two components but also a separate and isolated relation between the heat dissipation space 37 in the heat dissipation assembly 31 and the first circulation space 17 of the case 1. The second heat dissipation component 312 further includes a plurality of cooling fins 313 as shown in FIG. 7. When the display module 3 is disposed within the case 1, the cooling fins 313 of the second heat dissipation component 312 are configured to extend towards the first circulation space 17.

Figure 9:
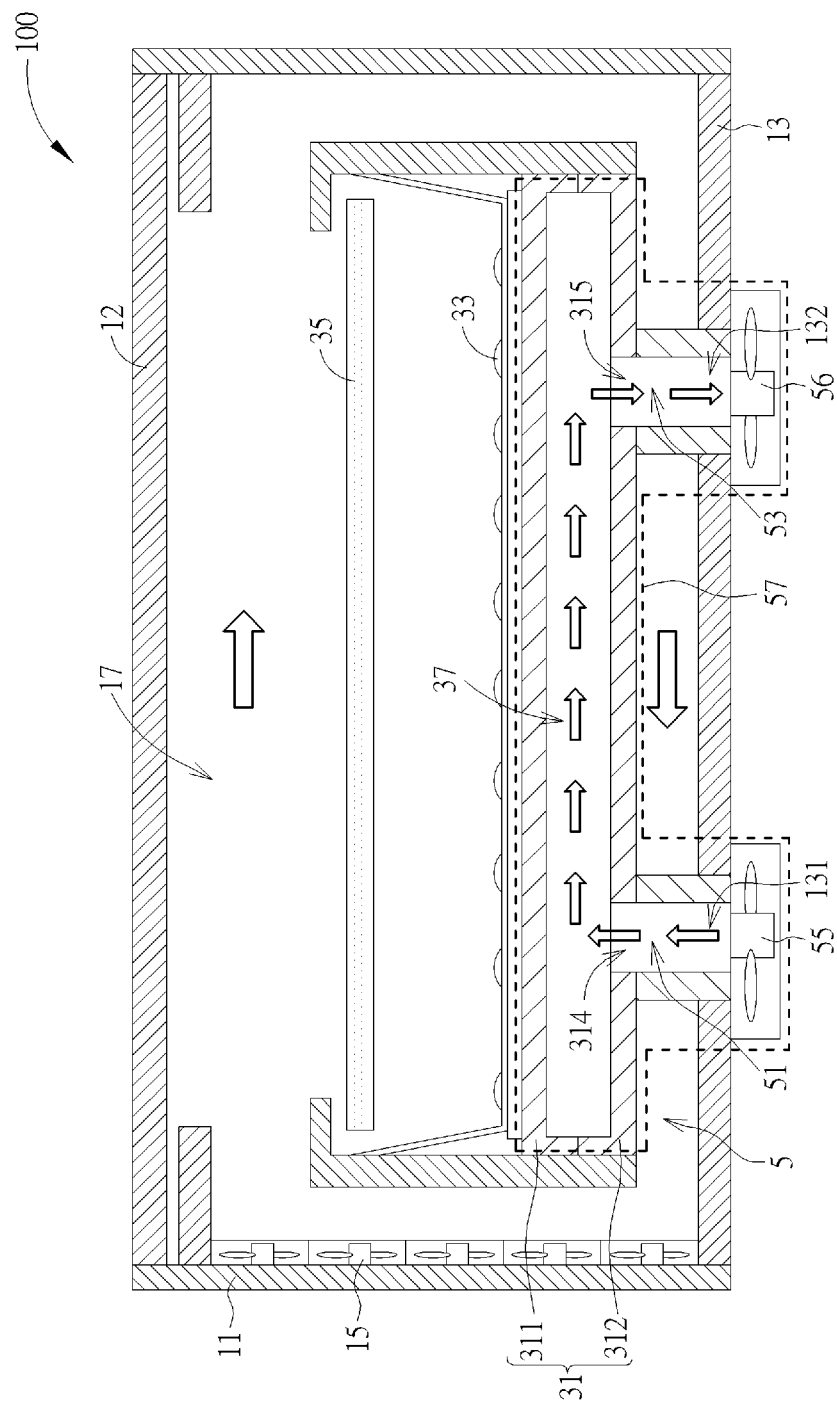
FIG. 9 is a schematic diagram showing formation of mutually independent first circulation space and second circulation space of the display assembly.

Please refer to FIG. 9. FIG. 9 is a schematic diagram showing formation of mutually independent first circulation space and second circulation space of the display assembly. It should be noted that for descriptive purpose, the components in FIG. 9 have been undergone transformation in size and proportion for a clearer presentation of technical features of the invention. Furthermore, the second heat dissipation component 312 of the heat dissipation assembly 31 has a second inlet 314 and a second outlet 315 whereas the heat dissipation space 37 of the hollow heat dissipation assembly 31 is formed and situated between the second inlet 314 and the second outlet 315.

Disposed at substantially between the back plate 13 of the case 1 and the heat dissipation assembly 31 of the display module 3, the circulation structure 5 of the display assembly 100 includes an intake channel 51, an exhaust channel 53, a convection generator 55, and a convection generator 56. The intake channel 51 is connected between the first inlet 131 of the back plate 13 and the second inlet 314 of the heat dissipation assembly 31 whereas the exhaust channel 53 is connected between the first outlet 132 of the back plate 13 and the second outlet 315 of the heat dissipation assembly 31. The convection generator 55 is disposed at the intake channel 51 and the convection generator 56 is disposed at the exhaust channel 53, both of which can be implemented in the form of a spoiler or a fan. FIG. 9 shows that the display assembly 100 of the invention divides the circulation of cooling air into two separate and independent spaces, i.e., the first circulation space 17 is isolated from the second circulation space 57. Formed on the assembling of the back plate 13 to the main body 11, the first circulation space 17 as a closed loop in the case 1 includes space between the front plate 12 of the case 1 and the display surface 35 of the display module 3, and also includes space between the back plate 13 of the case land the heat dissipation assembly 31 of the display module 3. Air in the first circulation space 17 is primarily circulated with the first circulation space 17 by the internal fan 15. It should be noted that the circulation structure 5 of the invention may include one or more sets, each including the intake channel 51, the exhaust channel 53, the convection generator 55, and the convection generator 56. The embodiments and illustrations pose no limitation to the invention.

Additionally, the area enclosed by the dashed lines in FIG. 9 shows that the circulation structure 5 establishes a second circulation space 57 (or external circulation space) by the intake channel 51, the heat dissipation space 37 of the heat dissipation assembly 31, and the exhaust channel 53. In one embodiment, the convection generator 55 brings an air flow from outside the case 1 to enter the second circulation space 57 through the first inlet 131, going through the intake channel 51, the heat dissipation space 37, the exhaust channel 53, and finally discharged from the first outlet 132. Generated by the backlight source 33 of the display module 3, the heat is conducted to the first heat dissipation component 311 of the heat dissipation assembly 31, brought away by the cold air entering the heat dissipation space 37, and finally discharged through the exhaust channel 53 and from the first outlet 132. Swapping of cold and hot air hence cools down the backlight source 33. On the other hand, the heat comes from the front plate 12's absorption of the radiation from the sun and operation of the substrate and the panel of the display module 3 will be further conducted away by the plurality of cooling fins 313 on the second heat dissipation component 312 when air is flowing in the first circulation space 17 and passing through the second heat dissipation component 312 of the heat dissipation assembly 31, following the same pattern as the cold air entering the heat dissipation space 37 taking away the heat on the second heat dissipation component 312. Accordingly, heat exchange is made on the internal circulation and the external circulation.

Figure 10:
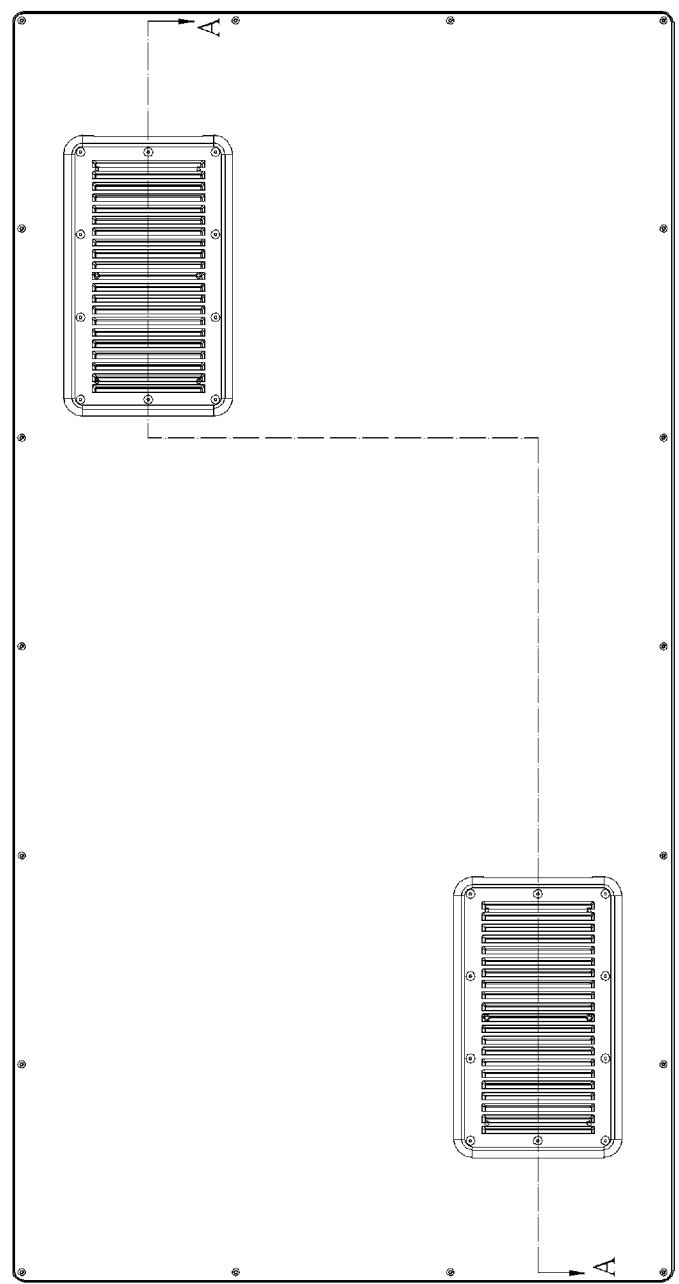
FIG. 10 is a schematic diagram showing a top view of the rear of the display assembly.
Figure 11:
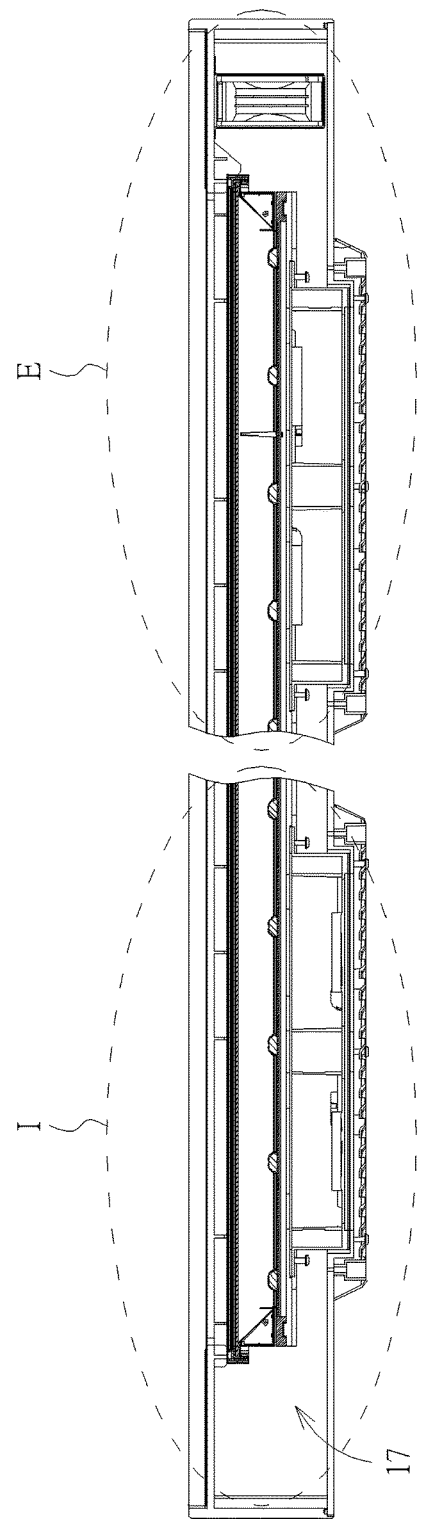
FIG. 11 is a schematic diagram of a cross sectional view of the display assembly in FIG. 10 along line A-A.
Figure 12:
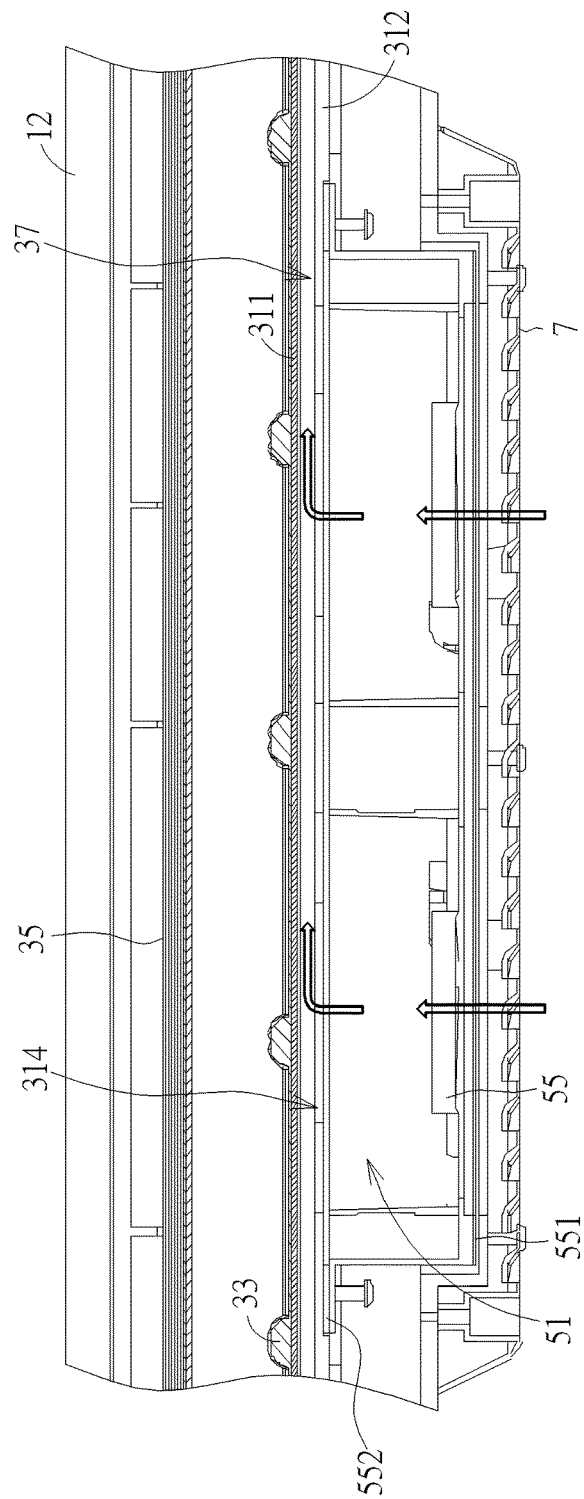
FIG. 12 is a schematic diagram of a partial enlarged view of an area I in FIG. 11.
Figure 13:
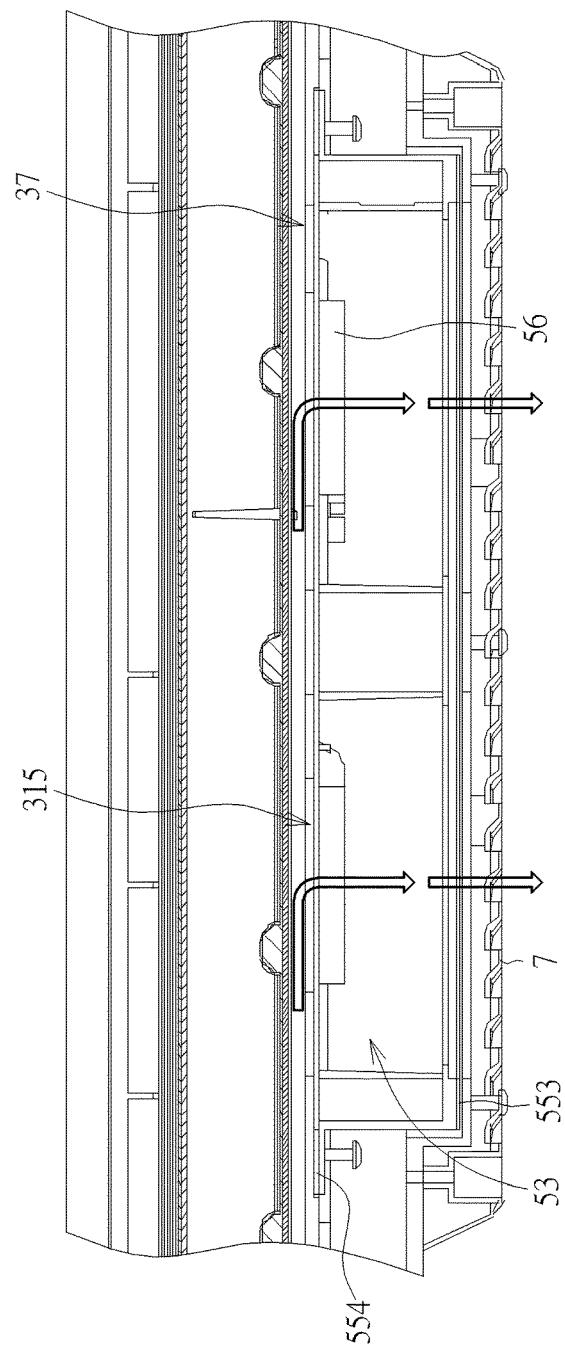
FIG. 13 is a schematic diagram of a partial enlarged view of an area E in FIG. 11.

Please refer to FIG. 10 to FIG. 13. FIG. 10 is a schematic diagram showing a top view of the rear of the display assembly, FIG. 11 is a schematic diagram of a cross sectional view of the display assembly in FIG. 10 along line A-A, FIG. 12 is a schematic diagram of a partial enlarged view of an area I in FIG. 11, and FIG. 13 is a schematic diagram of a partial enlarged view of an area E in FIG. 11. Each and every part of the circulation structure between the heat dissipation assembly and the back cover has been described in FIG. 9 and related paragraphs. It should be noted that the second circulation space 57 of the invention is separated and isolated from any other part inside the case 1 (including the first circulation space 17 and most of the display module 3), ensuring that the dust or vapor in the cold air channeled from outside has no way of getting contact with any other part inside the case 1. One of the realizable ways to do so is to carry out air-tight and water-proof design on the intake channel 51 and the exhaust channel 53; in other words, junctions of the intake channel 51 to the first inlet 131 and the second inlet 314 can be made air-tight and water-proof and junctions of the exhaust channel 523 to the first outlet 132 and the second outlet 315 are also made air-tight and water-proof. FIG. 12 and FIG. 13 show one embodiment for using water-proof rings 551, 553 at the fan parts of the convection generators 55, 56 and water-proof rings 552, 554 at the frame parts of the convection generators 55, 56. The water-proof rings 551, 552, 553, 554 can be implemented in the form of O-rings or other types of sealing rings, rubber rings for such purpose. Additionally, dust shields 7 may also be further disposed on the first inlet 131 and the first outlet 132 of the back plate 13 for enhanced blockage of dust above a certain size from entering the second circulation space and also for water proof to a certain extent.

The outdoor flat panel display assembly provided in the invention redesigns the back cover of the display module where an isolated external circulation structure is implemented to the back cover of the display module and the back plate of the case. Cold air is then introduced into the heat dissipation space within the back cover via external circulating route while heat produced by the backlight, the system circuit board, and by the radiation of the sun can be dissipated through the external circulating route. The external circulation space is completely isolated from the internal space of the case in such a way that the vapor and dust contained in the introduced cold air are in no way to have contact with the components of the display and the glass of the case, substantially reducing the workload of cleaning and maintenance.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A display assembly with heat dissipation, comprising:
   a case comprising a main body and a back plate detachably assembled with the main body, the back plate comprising a first inlet and a first outlet, a first circulation space formed inside the case when the back plate is assembled with the main body;
   a display module disposed in the case;
   a heat dissipation assembly disposed at a side of the display module, the heat dissipation assembly comprising a second inlet and a second outlet, the heat dissipation assembly comprising a first heat dissipation component and a second heat dissipation component, the first heat dissipation component contacting a backlight source of the display module, the second heat dissipation component comprising the second inlet and the second outlet, the first heat dissipation component and the second heat dissipation component cooperatively forming a heat dissipation space when the first heat dissipation component and the second heat dissipation component are connected with each other; and
   a circulation structure, comprising:
      an intake channel connected between the first inlet and the second inlet;
      a convection generator disposed at the intake channel; and
      an exhaust channel connected between the first outlet and the second outlet;
      wherein a second circulation space is formed in the circulation structure by the intake channel, the heat dissipation assembly, and the exhaust channel, with the convection generator bringing an air flow to enter the first inlet through the second circulation space and be discharged from the first outlet.

2. The display assembly of claim 1, wherein the second heat dissipation component further comprises a plurality of cooling fins extending towards the first circulation space.

3. The display assembly of claim 1, wherein the first heat dissipation component and the second heat dissipation component form a unitary structure.

4. The display assembly of claim 1, wherein the heat dissipation assembly is a back cover of the display module.

5. The display assembly of claim 1, wherein the circulation structure further comprises another convection generator disposed at the exhaust channel.

6. The display assembly of claim 5, wherein the convection generators respectively disposed at the intake channel and the exhaust channel are spoilers or fans.

7. The display assembly of claim 1, further comprising an internal fan set disposed within the case for circulating air in the first circulation space.

8. The display assembly of claim 1, wherein the display module is an LCD module.

9. The display assembly of claim 8, wherein the main body comprises a transparent front plate faced with a display surface of the display module.

10. The display assembly of claim 9, wherein the first circulation space comprises space between the front plate of the case and the display surface of the display module.

11. The display assembly of claim 1, further comprising two dust shields respectively covering the first inlet and the first outlet.

12. The display assembly of claim 1, wherein junctions of the intake channel to the first inlet and the second inlet are air-tight and water-proof and junctions of the exhaust channel to the first outlet and the second outlet are air-tight and water-proof.

13. The display assembly of claim 1, wherein the first circulation space is isolated and disconnected from the second circulation space.

14. A display assembly with heat dissipation, comprising:
   a case comprising a main body and a back plate detachably assembled with the main body, the back plate comprising a first inlet and a first outlet, a first circulation space formed inside the case when the back plate is assembled with the main body;
   a display module disposed in the case;
   a heat dissipation assembly disposed at a side of the display module, the heat dissipation assembly comprising a second inlet and a second outlet, the heat dissipation assembly being a back cover of the display module; and
   a circulation structure, comprising:
      an intake channel connected between the first inlet and the second inlet;
      a convection generator disposed at the intake channel; and
      an exhaust channel connected between the first outlet and the second outlet;
      wherein a second circulation space is formed in the circulation structure by the intake channel, the heat dissipation assembly, and the exhaust channel, with the convection generator bringing an air flow to enter the first inlet through the second circulation space and be discharged from the first outlet.

15. The display assembly of claim 14, wherein the circulation structure further comprises another convection generator disposed at the exhaust channel.

16. The display assembly of claim 14, further comprising an internal fan set disposed within the case for circulating air in the first circulation space.

17. A display assembly with heat dissipation, comprising:
   a case comprising a main body and a back plate detachably assembled with the main body, the back plate comprising a first inlet and a first outlet, a first circulation space formed inside the case when the back plate is assembled with the main body;
   a display module disposed in the case;
   a heat dissipation assembly disposed at a side of the display module, the heat dissipation assembly comprising a second inlet and a second outlet; and
   a circulation structure, comprising:
      an intake channel connected between the first inlet and the second inlet;
      a convection generator disposed at the intake channel; and
      an exhaust channel connected between the first outlet and the second outlet;
      wherein junctions of the intake channel to the first inlet and the second inlet are air-tight and water-proof and junctions of the exhaust channel to the first outlet and the second outlet are air-tight and water-proof, a second circulation space is formed in the circulation structure by the intake channel, the heat dissipation assembly, and the exhaust channel, with the convection generator bringing an air flow to enter the first inlet through the second circulation space and be discharged from the first outlet.

18. The display assembly of claim 17, wherein the circulation structure further comprises another convection generator disposed at the exhaust channel.

19. The display assembly of claim 17, further comprising an internal fan set disposed within the case for circulating air in the first circulation space.

* * * * *